United States Patent
Shim et al.

(10) Patent No.: US 8,643,163 B2
(45) Date of Patent: Feb. 4, 2014

(54) INTEGRATED CIRCUIT PACKAGE-ON-PACKAGE STACKING SYSTEM AND METHOD OF MANUFACTURE THEREOF

(75) Inventors: Il Kwon Shim, Singapore (SG); Byung Joon Han, Singapore (SG); Seng Guan Chow, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 168 days.

(21) Appl. No.: 12/371,730

(22) Filed: Feb. 16, 2009

(65) Prior Publication Data

US 2009/0146315 A1 Jun. 11, 2009

Related U.S. Application Data (63) Continuation-in-part of application No. 11/458,065, filed on Jul. 17, 2006, now abandoned.

(60) Provisional application No. 60/595,822, filed on Aug. 8, 2005.

(51) Int. Cl.
    *H01L 23/02* (2006.01)
(52) U.S. Cl.
    USPC .................. 257/686; 257/777; 257/E23.085; 438/109
(58) Field of Classification Search
    USPC .................. 257/686, 777, E23.085; 438/109
    See application file for complete search history.

(56) References Cited

U.S. PATENT DOCUMENTS

| | | | |
|---|---|---|---|
| 5,397,917 A | 3/1995 | Ommen et al. | |
| 5,579,207 A | 11/1996 | Hayden et al. | |
| 5,748,452 A | 5/1998 | Londa | |
| 5,854,507 A | 12/1998 | Miremadi et al. | |
| 5,963,430 A | 10/1999 | Londa | |
| 6,101,100 A | 8/2000 | Londa | |
| 6,303,997 B1 * | 10/2001 | Lee | 257/778 |
| 6,861,288 B2 * | 3/2005 | Shim et al. | 438/109 |
| 6,919,631 B1 | 7/2005 | Hoffman et al. | |
| 7,259,455 B2 | 8/2007 | Seto | |
| 7,294,532 B2 * | 11/2007 | Imamura et al. | 438/108 |
| 2003/0006496 A1 | 1/2003 | Vaiyapuri | |
| 2003/0047807 A1 * | 3/2003 | Alcoe et al. | 257/734 |
| 2003/0137041 A1 * | 7/2003 | Blackshear et al. | 257/686 |
| 2004/0075164 A1 * | 4/2004 | Pu et al. | 257/686 |
| 2004/0119152 A1 | 6/2004 | Karnezos et al. | |
| 2004/0178508 A1 * | 9/2004 | Nishimura et al. | 257/778 |
| 2005/0280139 A1 | 12/2005 | Zhao et al. | |
| 2007/0152313 A1 | 7/2007 | Periaman et al. | |
| 2009/0057871 A1 * | 3/2009 | Zhao et al. | 257/693 |

FOREIGN PATENT DOCUMENTS

WO  WO2005/036643 A1 *  4/2005

* cited by examiner

*Primary Examiner* — Phat X Cao
(74) *Attorney, Agent, or Firm* — Ishimaru & Associates LLP (57) ABSTRACT

An integrated circuit package-on-package stacking system includes: providing a first integrated circuit package, mounting a metalized interposer substrate over the first integrated circuit package, attaching a stiffener integrated with the metalized interposer substrate and having dimensions within package extents, and attaching a second integrated circuit package on the metalized interposer substrate adjacent the stiffener.

20 Claims, 4 Drawing Sheets

INTEGRATED CIRCUIT
PACKAGE-ON-PACKAGE STACKING
SYSTEM AND METHOD OF MANUFACTURE
THEREOF

CROSS-REFERENCE TO RELATED APPLICATIONS

This application is a continuation-in-part of co-pending U.S. application Ser. No. 11/458,065 filed Jul. 17, 2006, which claims priority from U.S. Provisional Patent Application Ser. No. 60/595,822 filed Aug. 8, 2005, and the subject matter thereof is hereby incorporated herein by reference thereto.

TECHNICAL FIELD

The present invention relates generally to integrated circuit packaging systems, and more particularly to a system for package-on-package stacking systems

BACKGROUND ART

The dimensions of many different types of state of the art electronic devices are ever decreasing. To reduce the dimensions of electronic devices, the structures by which the microprocessors, memory devices, other semiconductor devices, and other electronic components of these devices are packaged and assembled with circuit boards must become more compact.

One approach to reducing the sizes of assemblies of semiconductor devices and circuit boards has been to minimize the profiles of the semiconductor devices and other electronic components upon carrier substrates (e.g., circuit boards) so as to reduce the distances the semiconductor devices protrude from the carrier substrates. Various types of packaging technologies have been developed to facilitate orientation of semiconductor devices upon carrier substrates in this manner.

Some semiconductor device packages are configured to be oriented substantially parallel to a plane of a carrier substrate, such as a circuit board. Conventionally, semiconductor device packages included several layers stacked one on top of another (e.g., a bottom layer of encapsulant material, a die-attach paddle of a lead frame, a semiconductor die, and a top layer of encapsulant material). In addition, the leads or pins of conventional semiconductor device packages, which electrically connect such packages to carrier substrates, as well as provide support for the packages, are sometimes configured to space the semiconductor device packages apart from a carrier substrate. As a result, the overall thicknesses of these semiconductor device packages and the distances the packages protrude from carrier substrates are larger than is often desired for use in state of the art electronic devices.

"Flip-chip" technology, or controlled collapse chip connection (C-4), is another example of an assembly and packaging technology that results in a semiconductor device being oriented substantially parallel to a carrier substrate, such as a circuit board. In flip-chip technology, the bond pads or contact pads of a semiconductor device are arranged in an array over a major surface of the semiconductor device. Flip-chip techniques are applicable to both bare and packaged semiconductor devices. A packaged flip-chip type semiconductor device, which typically has a ball grid array connection pattern, typically includes a semiconductor die and a substrate, which is typically termed an "interposer." The interposer may be disposed over either the back side of the semiconductor die or the front (active) surface thereof.

When the interposer is positioned adjacent the back side of the semiconductor die, the bond pads of the semiconductor die are typically electrically connected by way of wire bonds or other intermediate conductive elements to corresponding contact areas on a top side of the interposer. These contact areas communicate with corresponding bumped contact pads on the back side of the interposer. This type of flip-chip assembly is positioned adjacent a carrier substrate with the back side of the interposer facing the carrier substrate.

If the interposer is positioned adjacent the active surface of the semiconductor die, the bond pads of the semiconductor die may be electrically connected to corresponding contact areas on an opposite, top surface of the interposer by way of intermediate conductive elements that extend through one or more holes formed in the interposer. Again, the contact areas communicate with corresponding contact pads on the interposer. In this type of flip-chip semiconductor device assembly, however, the contact pads are also typically located on the top surface of the interposer. Accordingly, this type of flip-chip assembly is positioned adjacent a carrier substrate by orienting the interposer with the top surface facing the carrier substrate.

In each of the foregoing types of flip-chip semiconductor devices, the contact pads of the interposer are disposed in an array that has a footprint that mirrors an arrangement of corresponding terminals formed on a carrier substrate. Each of the bond (on bare flip-chip semiconductor dice) or contact (on flip-chip packages) pads and its corresponding terminal may be electrically connected to one another by way of a conductive structure, such as a solder ball, that also spaces the interposer some distance away from the carrier substrate.

The space between the interposer and the carrier substrate may be left open or filled with a so-called "underfill" dielectric material that provides additional electrical insulation between the semiconductor device and the carrier substrate. In addition, each of the foregoing types of flip-chip type semiconductor devices may include an encapsulant material covering portions or substantially all of the interposer and/or the semiconductor die.

The thicknesses of conventional flip-chip type packages having ball grid array connection patterns are defined by the combined thicknesses of the semiconductor die, the interposer, and the conductive structures (e.g., solder balls) that protrude above the interposer or the semiconductor die. As with the flat packages, conventional flip-chip type packages are often undesirably thick for use in small, thin, state of the art electronic devices.

Thinner, or low-profile, flip-chip type packages have been developed which include recesses that are configured to at least partially receive semiconductor devices. While interposers that include recesses for partially receiving semiconductor devices facilitate the fabrication of thinner flip-chip type packages, the semiconductor dice of these packages, as well as intermediate conductive elements that protrude beyond the outer surfaces of either the semiconductor dice or the interposers, undesirably add to the thicknesses and size of these packages.

Thus, a need still remains for an integrated circuit package-on-package stacking system. In view of the commercial trends to shrink commodity electronic devices, it is increasingly critical that answers be found to these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit package-on-package stacking system including: providing a first integrated circuit package, mounting a metalized interposer substrate over the first integrated circuit package, attaching a stiffener integrated with the metalized interposer substrate and having dimensions within package extents, and attaching a second integrated circuit package on the metalized interposer substrate adjacent the stiffener.

The present invention provides an integrated circuit package-on-package stacking system, including: a first integrated circuit package; a metalized interposer substrate over the first integrated circuit package; a stiffener integrated with the metalized interposer substrate and having dimensions within package extents; and a second integrated circuit package on the metalized interposer substrate adjacent the stiffener.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" means the method and the apparatus of the present invention. The term "processing" as used herein includes stamping, forging, patterning, exposure, development, etching, cleaning, and/or removal of the material or laser trimming as required in forming a described structure.

Figure 1:
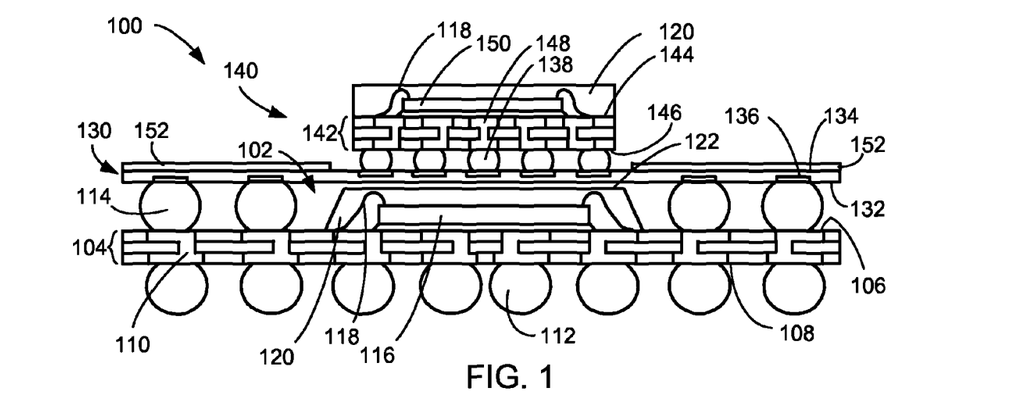
FIG. 1 is a cross-sectional view of an integrated circuit package-on-package stacking system in a first embodiment of the present invention.

Referring now to FIG. 1, therein is shown a cross-sectional view of an integrated circuit package-on-package stacking system 100 in a first embodiment of the present invention. The cross-sectional view of the integrated circuit package-on-package stacking system 100 depicts a first integrated circuit package 102 having a first substrate 104 with a substrate top 106 and a substrate bottom 108.

The first substrate 104 has a through conductor 110, which serves as the attach point, on the substrate bottom 108, for electrical interconnects 112, such as solder balls, solder columns or stud bumps. The through conductor 110 is also the attach point, on the substrate top 106, for transition interconnects 114, such as solder balls, solder columns or stud bumps.

A first integrated circuit 116 is mounted on the substrate top 106 and is coupled to the substrate top 106 by bond wires 118. An epoxy molding compound 120 encapsulates the first integrated circuit 116, the bond wires 118, and a portion of the substrate top 106. The transition interconnect 114 can be exposed from or uncovered by the epoxy molding compound 120. The first integrated circuit package 102 can include the first integrated circuit 116.

A mold cap 122, on the epoxy molding compound 120, is positioned slightly below a metalized interposer substrate 130, such as a flexible tape, an organic epoxy resin, a ceramic, an FR4 printed circuit board, or low dielectric materials. The mold cap 122 may act as a stabilizer preventing collapse of the transition interconnects 114 during the reflow process.

The metalized interposer substrate 130 has an interposer bottom 132 and an interposer top 134. There are contact pads 136 on both the interposer top 134 and the interposer bottom 132. The contact pads 136 on the interposer bottom 132 serve as attach points for the transition interconnects 114, while the contact pads 136 on the interposer top 134 serve as attach points for secondary interconnects 138, such as solder balls, solder columns or stud bumps.

A second integrated circuit package 140, such as a ball grid array package, is mounted directly on the interposer top 134 and coupled to the contact pads 136 by the secondary interconnects 138. The second integrated circuit package 140 has a second substrate 142 with a second substrate top 144 and a second substrate bottom 146. The second substrate 142 has contact vias 148 that act as a signal path to a second integrated circuit 150, which may be a wire bond IC or a flipchip IC.

In this example, the second integrated circuit 150 is a wire bond IC and is coupled to the contact vias 148 by the bond wires 118. The epoxy molding compound 120 encapsulates the second integrated circuit 150, the bond wires 118, and the second substrate top 144. The secondary interconnects 138 are package interconnects for the second integrated circuit package 140, which allow the first and second integrated circuit packages 102 and 140 that contain wire bonded integrated circuits to be connected by a different, non-wire bonded package interconnect. The epoxy molding compound 120 encapsulates the second integrated circuit 150, the bond wires 118, and the second substrate top 144.

Structural integrity including planar rigidity of the metalized interposer substrate 130 can be strengthened or reinforced by a stiffener 152. The stiffener 152 can include epoxy resin, polymeric material, metallic material, or any other materials that mitigate warpage of the metalized interposer substrate 130 or the integrated circuit package-on-package stacking system 100.

The stiffener 152 can be selectively or strategically integrated only at the outer periphery of the metalized interposer substrate 130 including on the interposer top 134, on the interposer bottom 132, or embedded into materials of the metalized interposer substrate 130. A plane of the interposer top 134 or the interposer bottom 132 can be substantially planar to a side of the stiffener 152 having the largest surface area. The stiffener 152 can also provide heat dissipation or shielding for electromagnetic interference (EMI).

The second integrated circuit package 140 may be a smaller size than the first integrated circuit package 102. The metalized interposer substrate 130 provides a redistribution layer for bridging electrical connections between the first integrated circuit package 102 and the second integrated circuit package 140. The metalized interposer substrate 130 may provide a flexible ball pitch for the second integrated circuit package 140, thus allowing the second integrated circuit package 140 to be much smaller than the first integrated circuit package 102.

For example, the metalized interposer substrate 130 can be formed of a single dielectric layer with conductive traces on the interposer bottom 132 or the interposer top 134. Conductive traces on the interposer bottom 132 can be electrically connected to conductive traces on the interposer top 134. Materials and structure of the metalized interposer substrate 130 preferably provide a significantly thinner interposer reducing package height.

It has been unexpectedly discovered that the metalized interposer substrate 130 provides significantly smaller package dimensions including reduced package height. It has also been unexpectedly discovered that selectively or strategically attaching the stiffener 152 provides improved structural integrity without increasing package height. Further, the location, dimensions, or materials of the stiffener 152 mitigate structural deformation such as warpage within the reduced package extents provided by or based on the metalized interposer substrate 130. The second integrated circuit package 104 is centered over the stiffener 152 supported only by the metalized interposer substrate 130.

Figure 2:
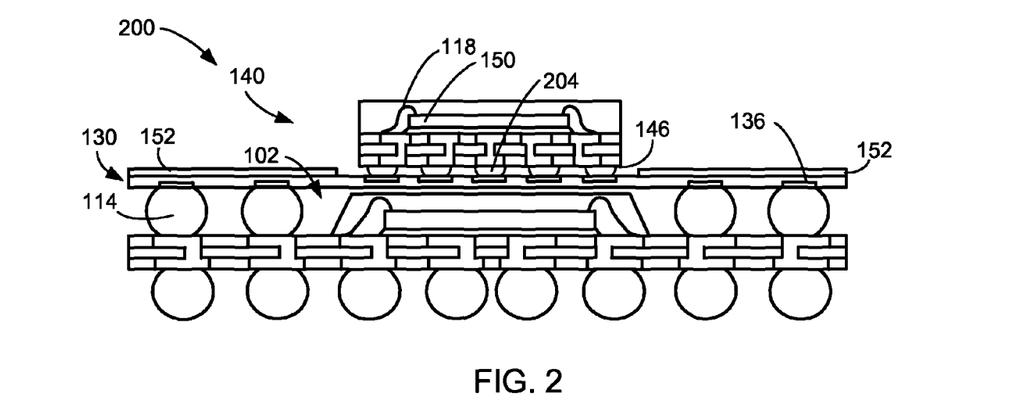
FIG. 2 is a cross-sectional view of an integrated circuit package-on-package stacking system in a second embodiment of the present invention.

Referring now to FIG. 2, therein is shown a cross-sectional view of an integrated circuit package-on-package stacking system 200 in a second embodiment of the present invention. The cross-sectional view of the integrated circuit package-on-package stacking system 200 depicts the first integrated circuit package 102 coupled to the metalized interposer substrate 130 with the stiffener 152 by the transition interconnects 114. The second integrated circuit package 140, such as a land grid array package, is mounted directly on the metalized interposer substrate 130.

The second integrated circuit package 140 is attached to the contact pads 136 by a land 204, such as a gold plated copper region, on the second substrate bottom 146. The land 204 is a package interconnect for the second integrated circuit package 140, which allow wire bonded first and second integrated circuit packages 102 and 140 that contain wire bonded integrated circuits to be connected by a different non-wire bonded package interconnect. The use of the land 204 interface helps reduce the over all height of the integrated circuit package-on-package stacking system 200.

Figure 3:
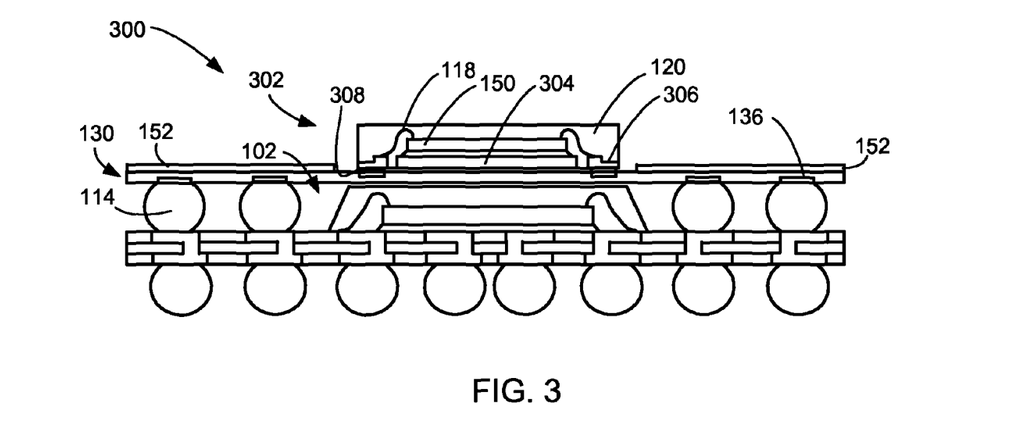
FIG. 3 is a cross-sectional view of an integrated circuit package-on-package stacking system in a third embodiment of the present invention.

Referring now to FIG. 3, therein is shown a cross-sectional view of an integrated circuit package-on-package stacking system 300 in a third embodiment of the present invention. The cross-sectional view of the integrated circuit package-on-package stacking system 300 depicts the first integrated circuit package 102 coupled to the metalized interposer substrate 130 with the stiffener 152 by the transition interconnects 114. A second integrated circuit package 302, such as a leadless package or a quad flat no-lead package (QFN), is mounted on the metalized interposer substrate 130.

The second integrated circuit package 302 has a die paddle 304, which may be optional, and the second integrated circuit 150 mounted thereon. For illustrative purposes the second integrated circuit package 302 is shown as a wire bond IC, though it is understood that it may also be a flipchip type of integrated circuit. The second integrated circuit 150 is coupled to an interface contact 306 by the bond wires 118. The second integrated circuit package 302 is electrically connected to the metalized interposer substrate 130 by a solder paste 308 between the interface contact 306 and the contact pads 136. The epoxy molding compound 120 encapsulates the second integrated circuit 150, the bond wires 118, the die paddle 304, and the interface contact 306.

Figure 4:
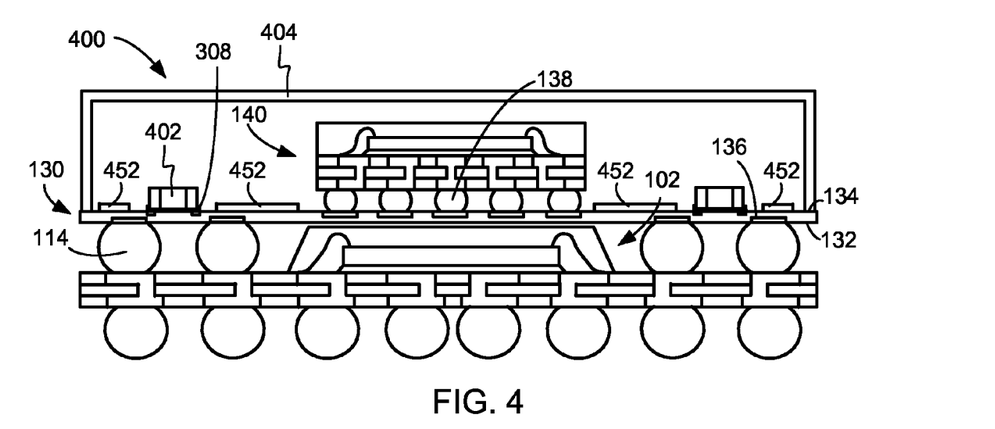
FIG. 4 is a cross-sectional view of an integrated circuit package-on-package stacking system in a fourth embodiment of the present invention.

Referring now to FIG. 4, therein is shown a cross-sectional view of an integrated circuit package-on-package stacking system 400 in a fourth embodiment of the present invention. The cross-sectional view of the integrated circuit package-on-package stacking system 400 depicts the first integrated circuit package 102 coupled to the metalized interposer substrate 130 by the transition interconnects 114. The second integrated circuit package 140, such as a ball grid array package, is mounted on the contact pads 136 by the secondary interconnects 138.

A discrete component 402, such as an active or a passive component, may be attached to the contact pads 136 by the solder paste 308. The addition of the discrete component 402 adds flexibility to the integrated circuit package-on-package stacking system 400. An electromagnetic shield 404 or a heat sink (not shown) may optionally be added to the integrated circuit package-on-package stacking system 400 for an additional level of flexibility.

Structural integrity including planar rigidity of the metalized interposer substrate 130 can be strengthened or reinforced by stiffeners 452. The stiffeners 452 can include epoxy resin, polymeric material, metallic material, or any other materials that mitigate warpage of the metalized interposer substrate 130 or the integrated circuit package-on-package stacking system 400.

The stiffeners 452 can be selectively or strategically integrated with the metalized interposer substrate 130 including on the interposer bottom 132, on the interposer bottom 132, or embedded into materials of the metalized interposer substrate 130. A plane of the interposer top 134 or the interposer bottom 132 can be substantially planar to a side of the stiffeners 452 having the largest surface area. The stiffeners 452 can also provide thermal dissipation or shielding from electromagnetic interference (EMI).

Figure 5:
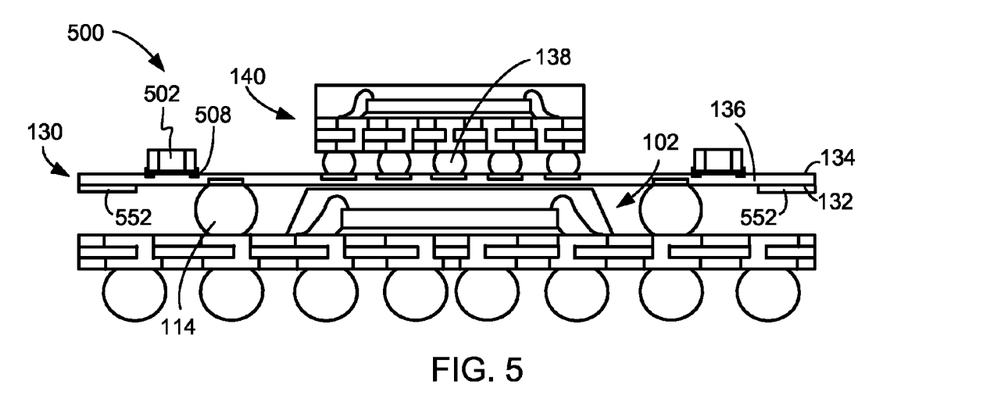
FIG. 5 is a cross-sectional view of an integrated circuit package-on-package stacking system in a fifth embodiment of the present invention.

Referring now to FIG. 5, therein is shown a cross-sectional view of an integrated circuit package-on-package stacking system 500 in a fifth embodiment of the present invention. The integrated circuit package-on-package stacking system 500 includes the first integrated circuit package 102 coupled to the metalized interposer substrate 130 by the transition interconnects 114. The second integrated circuit package 140, such as a ball grid array package, is mounted on the contact pads 136 by the secondary interconnects 138.

A discrete component 502, such as an active or a passive component, may be attached to the contact pads 136 by a solder paste 508. The addition of the discrete component 502 adds flexibility to the integrated circuit package-on-package stacking system 500.

Structural integrity including planar rigidity of the metalized interposer substrate 130 can be strengthened or reinforced by stiffeners 552. The stiffeners 552 can include epoxy resin, polymeric material, metallic material, or any other materials that mitigate warpage of the metalized interposer substrate 130 or the integrated circuit package-on-package stacking system 500.

The stiffeners 552 can be selectively or strategically integrated with the metalized interposer substrate 130 on the interposer bottom 132, on the interposer top 134, or embedded into materials of the metalized interposer substrate 130. A plane of the interposer top 134 or the interposer bottom 132 can be substantially planar to a side of the stiffeners 552 having the largest surface area. The stiffeners 552 can also provide thermal dissipation or shielding from electromagnetic interference (EMI).

Figure 6:
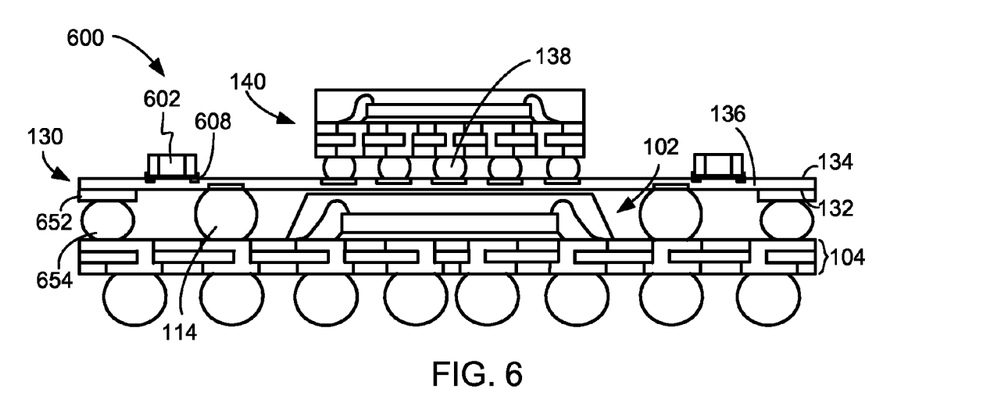
FIG. 6 is a cross-sectional view of an integrated circuit package-on-package stacking system in a sixth embodiment of the present invention.

Referring now to FIG. 6, therein is shown a cross-sectional view of an integrated circuit package-on-package stacking system 600 in a sixth embodiment of the present invention. The integrated circuit package-on-package stacking system 600 includes the first integrated circuit package 102 coupled to the metalized interposer substrate 130 by the transition interconnects 114. The second integrated circuit package 140, such as a ball grid array package, is mounted on the contact pads 136 by the secondary interconnects 138.

A discrete component 602, such as an active or a passive component, may be attached to the contact pads 136 by a solder paste 608. The addition of the discrete component 602 adds flexibility to the integrated circuit package-on-package stacking system 600.

Structural integrity including planar rigidity of the metalized interposer substrate 130 can be strengthened or reinforced by stiffeners 652. The stiffeners 652 can include epoxy resin, polymeric material, metallic material, or any other materials that mitigate warpage of the metalized interposer substrate 130 or the integrated circuit package-on-package stacking system 600.

The stiffeners 652 can be selectively or strategically integrated with the metalized interposer substrate 130 on the interposer bottom 132, on the interposer top 134, or embedded into materials of the metalized interposer substrate 130. A plane of the interposer top 134 or the interposer bottom 132 can be substantially planar to a side of the stiffeners 652 having the largest surface area. The stiffeners 652 can also provide thermal dissipation or shielding from electromagnetic interference (EMI).

A support 654 can be attached to the stiffeners 652 and the first substrate 104 or the first integrated circuit package 102. The support 654 can include solder, conductive epoxy, other conductive materials or other non-conductive materials. Conductive materials can provide enhanced thermal dissipation or grounding.

Figure 7:
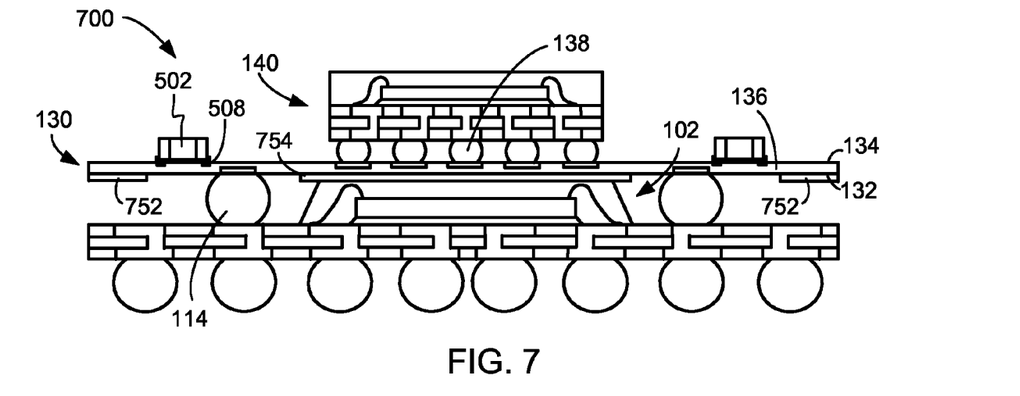
FIG. 7 is a cross-sectional view of an integrated circuit package-on-package stacking system in a seventh embodiment of the present invention.

Referring now to FIG. 7, therein is shown a cross-sectional view of an integrated circuit package-on-package stacking system 700 in a seventh embodiment of the present invention. Similar to the integrated circuit package-on-package stacking system 500, the integrated circuit package-on-package stacking system 700 includes the first integrated circuit package 102 coupled to the metalized interposer substrate 130 by the transition interconnects 114. The second integrated circuit package 140, such as a ball grid array package, is mounted on the contact pads 136 by the secondary interconnects 138.

The discrete component 502, such as an active or a passive component, may be attached to the contact pads 136 by the solder paste 508. The addition of the discrete component 502 adds flexibility to the integrated circuit package-on-package stacking system 700.

Structural integrity including planar rigidity of the metalized interposer substrate 130 can be strengthened or reinforced by stiffeners 752. The stiffeners 752 can include epoxy resin, polymeric material, metallic material, or any other materials that mitigate warpage of the metalized interposer substrate 130 or the integrated circuit package-on-package stacking system 700.

The stiffeners 752 can be selectively or strategically integrated with the metalized interposer substrate 130 on the interposer bottom 132, on the interposer top 134, or embedded into materials of the metalized interposer substrate 130. A plane of the interposer top 134 or the interposer bottom 132 can be substantially planar to a side of the stiffeners 752 having the largest surface area.

A package interface 754 can be attached to the metalized interposer substrate 130 and the first substrate 104 of the first integrated circuit package 102. The package interface 754 can include conductive or protective materials such as materials that provide thermal dissipation or shielding from electro magnetic interference (EMI).

Figure 8:
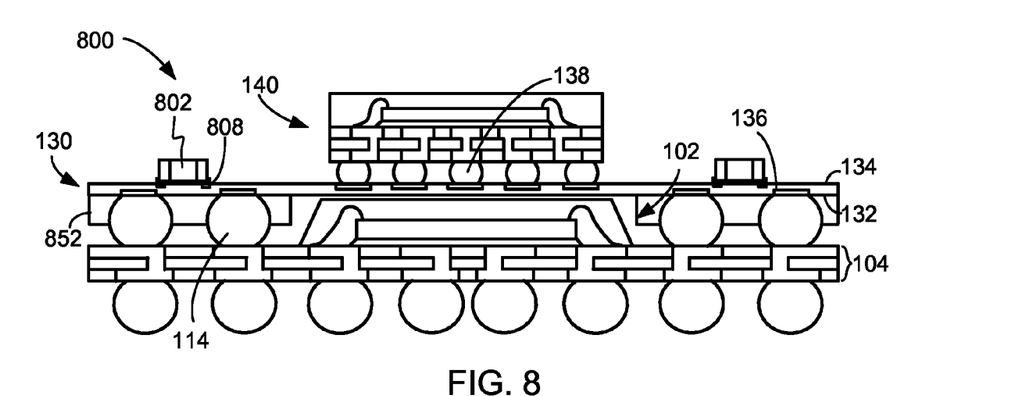
FIG. 8 is a cross-sectional view of an integrated circuit package-on-package stacking system in an eighth embodiment of the present invention.

Referring now to FIG. 8, therein is shown a cross-sectional view of an integrated circuit package-on-package stacking system 800 in an eighth embodiment of the present invention. The integrated circuit package-on-package stacking system 800 includes the first integrated circuit package 102 coupled to the metalized interposer substrate 130 by the transition interconnects 114. The second integrated circuit package 140, such as a ball grid array package, is mounted on the contact pads 136 by the secondary interconnects 138.

A discrete component 802, such as an active or a passive component, may be attached to the contact pads 136 by a solder paste 808. The addition of the discrete component 802 adds flexibility to the integrated circuit package-on-package stacking system 800.

Structural integrity including planar rigidity of the metalized interposer substrate 130 can be strengthened or reinforced by stiffeners 852. The stiffeners 852 can include epoxy resin, polymeric material, metallic material, or any other materials that mitigate warpage of the metalized interposer substrate 130 or the integrated circuit package-on-package stacking system 800.

The stiffeners 852 can be selectively or strategically integrated with the metalized interposer substrate 130 on the interposer bottom 132, on the interposer top 134, or embedded into materials of the metalized interposer substrate 130. The stiffeners 852 can be formed around or next to the transition interconnects 114. The stiffeners 852 can extend from the interposer bottom 132 to half or more of a height of the transition interconnects 114.

A plane of the interposer top 134, the interposer bottom 132, or the first substrate 104 can be substantially planar to a side of the stiffeners 852 having the largest surface area. The stiffeners 852 can also provide thermal dissipation or shielding from electromagnetic interference (EMI).

Figure 9:
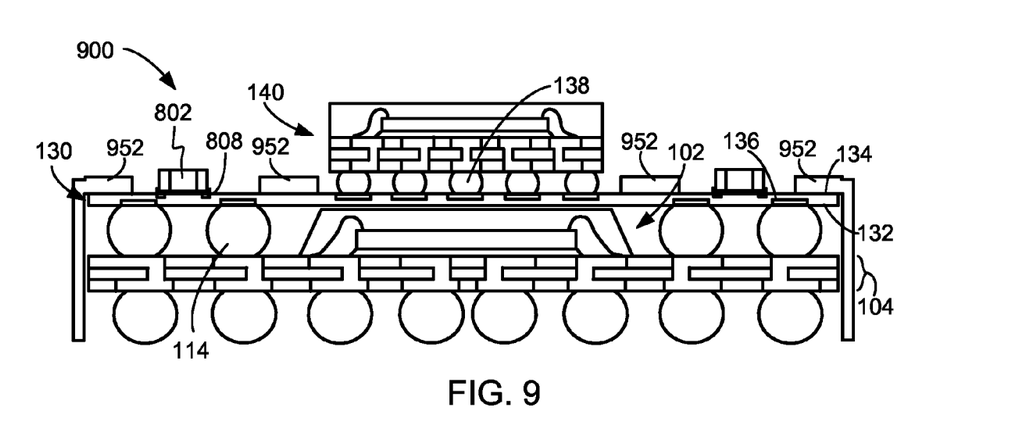
FIG. 9 is a cross-sectional view of an integrated circuit package-on-package stacking system in an eighth embodiment of the present invention.

Referring now to FIG. 9, therein is shown a cross-sectional view of an integrated circuit package-on-package stacking system 900 in an eighth embodiment of the present invention. Similar to the integrated circuit package-on-package stacking system 800, the integrated circuit package-on-package stacking system 900 includes the first integrated circuit package 102 coupled to the metalized interposer substrate 130 by the transition interconnects 114. The second integrated circuit package 140, such as a ball grid array package, is mounted on the contact pads 136 by the secondary interconnects 138.

The discrete component 802, such as an active or a passive component, may be attached to the contact pads 136 by the solder paste 808. The addition of the discrete component 802 adds flexibility to the integrated circuit package-on-package stacking system 900.

Structural integrity including planar rigidity of the metalized interposer substrate 130 can be strengthened or reinforced by stiffeners 952. The stiffeners 952 can include epoxy resin, polymeric material, metallic material, or any other materials that mitigate warpage of the metalized interposer substrate 130 or the integrated circuit package-on-package stacking system 900.

The stiffeners 952 can be selectively or strategically integrated with the metalized interposer substrate 130 on the interposer bottom 132, on the interposer top 134, or embedded into materials of the metalized interposer substrate 130. A plane of the interposer top 134, the interposer bottom 132, or the first substrate 104 can be substantially planar to a mounting side of the stiffeners 952.

The stiffeners 952 can also include extensions along an outer edge of the metalized interposer substrate 130 or the first substrate 104 thereby covering at least a portion of the outer edges. The stiffeners 952 can provide thermal dissipation or shielding from electromagnetic interference (EMI).

Figure 10:
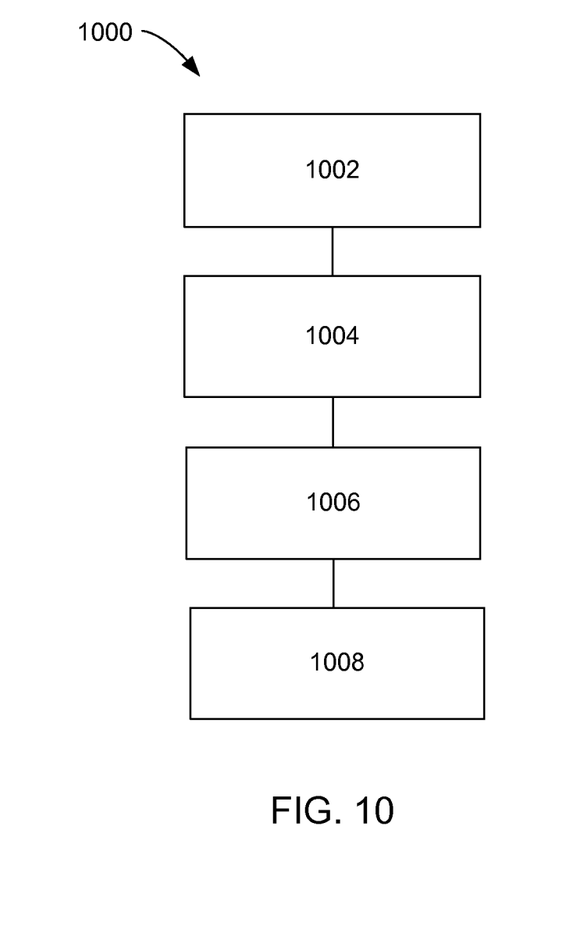
FIG. 10 is a flow chart of a method of manufacture of an integrated circuit package-on-package stacking system in an embodiment of the present invention.

Referring now to FIG. 10, therein is shown a flow chart of a method of manufacture of an integrated circuit package-on-package stacking system 1000 in an embodiment of the present invention. The system 1000 includes providing a first integrated circuit package in a block 1002; mounting a metalized interposer substrate over the first integrated circuit package in a block 1004; attaching a stiffener integrated with the metalized interposer substrate and having dimensions within package extents in a block 1006; and attaching a second integrated circuit package on the metalized interposer substrate adjacent the stiffener in a block 1008.

In greater detail, a system to provide an integrated circuit package-on-package stacking system, in an embodiment of the present invention, is performed as follows:

1. Providing a first integrated circuit package having a through conductor. (FIG. 1)
2. Mounting a metalized interposer substrate over the first integrated circuit package, in which the metalized interposer substrate provides a redistribution layer. (FIG. 1)
3. Attaching a stiffener on the metalized interposer substrate and having dimensions within package extents based on the metalized interposer substrate, (FIG. 1) and
4. Attaching a second integrated circuit package on the metalized interposer substrate adjacent the stiffener, in which providing a ball pitch for the second integrated circuit package requires less space than for the first integrated circuit package. (FIG. 1)

It has been unexpectedly discovered that attaching a small package on the metalized interposer substrate reduces the thermal expansion mismatch around the peripheral balls of the bottom package, thus enhancing the solder joint reliability.

It has been discovered that the present invention thus has numerous aspects.

A principle aspect that has been unexpectedly discovered is that the present invention provides a way to reduce manufacturing costs while increasing the solder joint reliability of the package-on-package system.

Another aspect is the several different types of package may be applied in the second package location. The flexibility of the metalized interposer substrate provides a quick and reliable way to combine functions in a package-on-package stack.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package-on-package stacking system, of the present invention furnishes important and heretofore unknown and unavailable solutions, capabilities, and functional aspects for producing stacked package designs. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package-on-package stacking system comprising:
    a first integrated circuit package having a first substrate and a first integrated circuit formed on the first substrate;
    a metalized interposer substrate of flexible tape over the first integrated circuit package;
    a stiffener integrated with the metalized interposer substrate thinner than the first substrate whereby the stiffener provides structural integrity and mitigates structural deformation, the stiffener having an extension along an outer edge of the metalized interposer substrate or the first substrate, the extension operable to cover at least a portion of the outer edge of the metalized interposer substrate or the first substrate;
    a second integrated circuit package directly on the metalized interposer substrate and supported only by the metalized interposer substrate; and a transition interconnect on the first integrated circuit package, the transition interconnect, entirely and directly below the stiffener, exposed between the first substrate and the metalized interposer substrate.

2. The system as claimed in claim 1 wherein the transition interconnect is attached to the metalized interposer substrate.

3. The system as claimed in claim 1 further comprising:
a contact pad on the metalized interposer substrate; and
a discrete component coupled to the contact pad.

4. The system as claimed in claim 1 wherein the second integrated circuit package is smaller than the first integrated circuit package.

5. The system as claimed in claim 1 further comprising an electromagnetic shield over the second integrated circuit package.

6. The system as claimed in claim 1 further comprising:
a through conductor in the first substrate of the first integrated circuit package;
wherein the metalized interposer substrate over the first integrated circuit package includes the metalized interposer substrate configured to provide a redistribution layer; and
wherein the stiffener integrated with the metalized interposer substrate includes dimensions within package extents based on the metalized interposer substrate.

7. The system as claimed in claim 1 wherein the transition interconnect is a solder ball.

8. The system as claimed in claim 3 wherein the discrete component is a passive component.

9. The system as claimed in claim 4 wherein the second integrated circuit package is a land grid array package.

10. The system as claimed in claim 5 wherein the electromagnetic shield is mounted on the metalized interposer substrate.

11. A method of manufacture of an integrated circuit package-on-package stacking system comprising:
providing a first integrated circuit package having a first substrate and a first integrated circuit formed on the first substrate;
mounting a metalized interposer substrate of flexible tape over the first integrated circuit package;
integrating a stiffener with the metalized interposer substrate thinner than the first substrate whereby the stiffener provides structural integrity and mitigates structural deformation, the stiffener having an extension along an outer edge of the metalized interposer substrate or the first substrate, the extension covering at least a portion of the outer edge of the metalized interposer substrate or the first substrate;
attaching a second integrated circuit package directly on the metalized interposer substrate and supported only by the metalized interposer substrate 130; and
attaching a transition interconnect on the first integrated circuit package, the transition interconnect entirely and directly below the stiffener and exposed between the first substrate and the metalized interposer substrate.

12. The method as claimed in claim 11 wherein attaching the transition interconnect includes attaching the transition interconnect to the metalized interposer substrate.

13. The method as claimed in claim 11 further comprising:
providing a contact pad on the metalized interposer substrate; and
coupling a discrete component to the contact pad.

14. The method as claimed in claim 11 wherein attaching the second integrated circuit package includes the second integrated circuit package being smaller than the first integrated circuit package.

15. The method as claimed in claim 11 further comprising providing an electromagnetic shield over the second integrated circuit package.

16. The method as claimed in claim 11 further comprising:
providing a through conductor in the first substrate of the first integrated circuit package;
wherein mounting the metalized interposer substrate includes configuring the metalized interposer substrate to provide a redistribution layer; and
wherein integrating the stiffener includes forming the stiffener with dimensions within package extents based on the metalized interposer substrate.

17. The method as claimed in claim 11 wherein attaching the transition interconnect includes providing the transition interconnect as a solder ball.

18. The method as claimed in claim 13
wherein coupling the discrete component to the contact pad includes coupling a passive component as the discrete component.

19. The method as claimed in claim 14 wherein attaching the second integrated circuit package includes attaching a land grid array package as the second integrated circuit package.

20. The method as claimed in claim 15 wherein providing the electromagnetic shield includes mounting the electromagnetic shield on the metalized interposer substrate.

* * * * *

UNITED STATES PATENT AND TRADEMARK OFFICE
CERTIFICATE OF CORRECTION

PATENT NO. : 8,643,163 B2  Page 1 of 1
APPLICATION NO. : 12/371730
DATED : February 4, 2014
INVENTOR(S) : Shim et al.

It is certified that error appears in the above-identified patent and that said Letters Patent is hereby corrected as shown below:

In the Specification:

Column 5, line 35, after "substrate 130.", insert:

--The transition interconnects 114 are entirely and directly below the stiffener 152 and exposed between the first integrated circuit package 102 and the metallized interposer substrate 130.--

Signed and Sealed this
Twenty-fourth Day of May, 2016

Michelle K. Lee
*Director of the United States Patent and Trademark Office*